US008321744B2

(12) United States Patent
Stein et al.

(10) Patent No.: US 8,321,744 B2
(45) Date of Patent: Nov. 27, 2012

(54) CHANNEL ADAPTIVE ITERATIVE TURBO DECODER SYSTEM AND METHOD

(75) Inventors: Yosef Stein, Sharon, MA (US); Hazarathaiah Malepati, Norwood, MA (US); Haim Primo, Gane-Tikwa (IL)

(73) Assignee: Analog Devices, Inc., Norwood, MA (US)

(\*) Notice: Subject to any disclaimer, the term of this patent is extended or adjusted under 35 U.S.C. 154(b) by 1015 days.

(21) Appl. No.: 12/283,863

(22) Filed: Sep. 16, 2008

(65) Prior Publication Data
US 2010/0070819 A1    Mar. 18, 2010

(51) Int. Cl.
*H03M 13/00* (2006.01)
*H03M 13/03* (2006.01)
*H04L 5/12* (2006.01)
*H04L 27/06* (2006.01)

(52) U.S. Cl. ........ 714/752; 714/755; 714/786; 714/791; 714/793; 714/794; 714/795; 714/796; 375/341; 375/262

(58) Field of Classification Search .................. 714/752, 714/794–796, 791, 793, 786, 755; 375/341, 375/262
See application file for complete search history.

(56) References Cited

U.S. PATENT DOCUMENTS

| | | | | |
|---|---|---|---|---|
| 6,865,712 B2* | 3/2005 | Becker et al. | ................ | 714/796 |
| 6,957,376 B2* | 10/2005 | Becker et al. | ................ | 714/755 |
| 7,346,833 B2* | 3/2008 | Hagh et al. | ................ | 714/780 |
| 7,613,985 B2* | 11/2009 | Pons et al. | ................ | 714/774 |
| 7,882,413 B2* | 2/2011 | Chen et al. | ................ | 714/751 |
| 7,992,073 B2* | 8/2011 | Orio | ................ | 714/774 |
| 8,006,172 B2* | 8/2011 | Boyer et al. | ................ | 714/786 |
| 2002/0168033 A1* | 11/2002 | Suzuki et al. | ................ | 375/341 |
| 2004/0148556 A1* | 7/2004 | Hagh et al. | ................ | 714/755 |
| 2004/0225941 A1* | 11/2004 | Taffin | ................ | 714/755 |

FOREIGN PATENT DOCUMENTS
WO    WO-2005/064800 A1    7/2005

OTHER PUBLICATIONS

Shao et al., "Two Simple Stopping Criteria for Iterative Decoding", Aug. 16, 1998, IEEE Transactions on Communications, vol. 47 Issue: , pp. 279.*
Shibutani et al., "Reducing average number of turbo decoding iterations", Apr. 29, 1999, IEEE, vol. 35 Issue: 9, pp. 701-702.*
Vogt et al., "Increasing throughput of iterative decoders", IEEE, Jun. 2001, vol. 37, No. 12, pp. 770-771.*

(Continued)

*Primary Examiner* — John J Tabone, Jr.
(74) *Attorney, Agent, or Firm* — Bingham McCutchen LLP

(57) ABSTRACT

A channel adaptive iterative turbo decoder for computing with MAP decoders a set of branch metrics for a window of received data, computing the forward and reverse recursive path state metrics and computing from the forward and reverse recursive path state metrics the log likelihood ratio for 1 and 0 and interleaving the decision bits; and identifying those MAP decoder decision bits which are non-convergent, computing a set of branch metrics for the received data, computing from the forward and reverse recursive path state metrics the log likelihood ratio (LLR) for 1 and 0 for each non-converged decision bit and interleaving the non-convergent decision bits.

24 Claims, 13 Drawing Sheets

OTHER PUBLICATIONS

Claude E. Shannon, "A Mathematical Theory of Communication", The Bell System Technical Journal, 27, Jul. Oct. 1948, pp. 379-423.

Berrou et al., "Near Shannon Limit Error-Correcting Coding and Decoding: Turbo Codes (1)", Proc. IEEE Int. Conf. Commun., Geneva, Switzerland, 1993, pp. 1064-1070.

International Search Report and Written Opinion, for PCT/US2009/057079, 9 pages, Apr. 3, 2010.

Frey et al. "Early Detection and Trellis Splicing: Reduced-Complexity Iterative Decoding" IEEE Journal on Selected Areas in Communications, vol. 16, No. 2, Feb. 1998, (pp. 153-159).

* cited by examiner

CHANNEL ADAPTIVE ITERATIVE TURBO DECODER SYSTEM AND METHOD

FIELD OF THE INVENTION

This invention relates to a channel adaptive iterative turbo decoder system and method.

BACKGROUND OF THE INVENTION

Turbo codes have attracted great attention in the industry and research communities since their introduction in 1993 because of their remarkable performance. Turbo codes operate near (with SNR gap of 0.7 dB or less) the ultimate limits of capacity of a communication channel set by Claude E. Shannon (Shannon C. E., "A Mathematical Theory of Communication", Bell Systems Tech. Journal, 27, pp. 379-423, July 1948). Turbo codes were first proposed in "Near Shannon Limit Error-Correcting Coding: Turbo Codes", Proc IEEE Int. Conf. Commun., Geneva, Switzerland, pp. 1064-1070, 1993, by Berrou, Galvieux and Thitimajshims. Turbo codes are constructed using two concatenated constituent convolutional coders. In the turbo coding scheme, two component codes on different interleaved versions of the same information sequence are generated. On the decoder side, two maximum a posteriori (MAP) decoders are used to decode the decisions in an iterative manner. The MAP decoding algorithm uses the received data and parity symbols (which correspond to parity bits computed from actual and interleaved versions of data bits) and other decoder soft output (extrinsic) information to produce more reliable decisions. Both of these references are hereby incorporated in this application by reference in their entirety.

The MAP decoder is used to determine the most likely information bit that has been transmitted. To do so, the MAP decoder calculates the posteriori probabilities value for each transmitted data bit. Then the bit is decoded by assigning a decision value that corresponds to the maximum posteriori probability calculated by the Log Likelihood Ratio (LLR). Turbo codes have better performance as the number of iterations and the interleaver size increases in the channel environment. However, as the number of iterations and the interleaver size are increased, it requires more computational power which translates to more MIPS (million instructions per second) if done using a programmable core like a Digital Signal Processor (DSP) or more power if done in a hardware block.

For more information see U.S. Pat. No. 7,346,833 B2 and the references cited therein and the extensive list of references identified in the Background of Invention of that patent, all of which are hereby incorporated in this application by reference in their entireties.

SUMMARY OF THE INVENTION

It is therefore an object of this invention to provide a channel adaptive iterative turbo decoder system and method.

It is a further object of this invention to provide such a channel adaptive iterative turbo decoder system and method which requires less power.

It is a further object of this invention to provide such a channel adaptive iterative turbo decoder system and method which is MIPS adaptive to channel conditions.

It is a further object of this invention to provide such a channel adaptive iterative turbo decoder system and method which is superior in MIPS and/or power performance even to turbo decoders with stopping criteria.

It is a further object of this invention to provide such a channel adaptive iterative turbo decoder system and method which reduces MIPS while preserving performance.

It is a further object of this invention to provide such a channel adaptive iterative turbo decoder system and method which reduces computational complexity with reduction in number of non-convergent decision bits.

It is a further object of this invention to provide such a channel adaptive iterative turbo decoder system and method which reduces the window of path state metrics used to calculate the log likelihood ratio.

The invention results from the realization that a truly adaptive turbo decoder which reduces MIPS yet preserves BER (bit error rate) can be achieved in a fast mode by continuing the iterations of the MAP decoding process calculating the LLR's only for the non-convergent data points after a predetermined number of non-convergent data points remain, and can be achieved in a super fast mode by reducing the size of the window used to perform the MAP operations ($\alpha$'s, $\beta$'s and LLRs) when the number of non-convergent data points has fallen below a predefined number.

The subject invention, however, in other embodiments, need not achieve all these objectives and the claims hereof should not be limited to structures or methods capable of achieving these objectives.

This invention features a channel adaptive iterative turbo decoder system including first and second MAP decoders for computing a set of branch metrics for a window of received data, computing the forward recursive path state metrics, computing the reverse recursive path state metrics and computing from the forward and reverse recursive path state metrics the log likelihood ratio for 1 and 0 and interleaving the decision bits. A non-convergence detector identifies those decision bits which are non-convergent and enables at least one of the MAP decoders to compute a set of branch metrics for the received data, to compute the forward and reverse recursive path state metrics and to compute from the forward and reverse recursive path state metrics the log likelihood ratio for 1 and 0 for each non-convergent decision bit and interleave the non-convergent bits.

In a preferred embodiment the channel adaptive iterative turbo decoder system may further include a monitor device responsive to the number of non-convergent decision bits from at least one MAP decoder to define a reduced small window of path state metrics around each non-convergent decision bit and to compute from those path metrics the log likelihood ratio for 1 and 0 for each non-convergent decision bit and interleave the non-convergent bits. The reverse recursive path metrics may be initialized with equal probabilities. The reverse and forward recursive path metrics may be initialized with equal probabilities in each small window around the non-converged decision bits. The forward, reverse and LLR may be calculated using Log Max*( ). The forward, reverse and LLR may be calculated using Max Log Max( ). The turbo decoder may be a binary turbo decoder. The turbo decoder may be a duo binary turbo decoder.

This invention also features a channel adaptive iterative turbo decoder method including computing with MAP decoders a set of branch metrics for a window of received data, computing the forward and reverse recursive path state metrics and computing from the forward and reverse recursive path state metrics the log likelihood ratio for 1 and 0 and interleaving the decision bits. The method further includes identifying those MAP decoder decision bits which are non-convergent, computing a set of branch metrics for the received data, computing from the forward and reverse recursive path state metrics the log likelihood ratio (LLR) for 1 and 0 for each non-converged decision bit and interleaving the non-convergent decision bits.

In a preferred embodiment the channel adaptive iterative turbo decoder method may further include defining, responsive to the number of MAP decoder non-convergent decision bits, a reduced small window of path state metrics around each non-convergent decision bit and to compute from those path metrics the log likelihood ratio for 1 and 0 for each non-convergent decision bit and interleave the non-convergent bits. The reverse recursive path metrics may be initialized with equal probabilities. The reverse and forward recursive path metrics in each small window around the non-converged decision bits may be initialized with equal probability. The forward and reverse recursive path state metrics and LLR may be calculated using Log Max*( ). The forward and reverse recursive path state metrics and LLR may be calculated using Max Log Max ( ). The turbo decoder method may be a binary turbo decoder method. The turbo decoder method may be a duo binary turbo decoder method.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
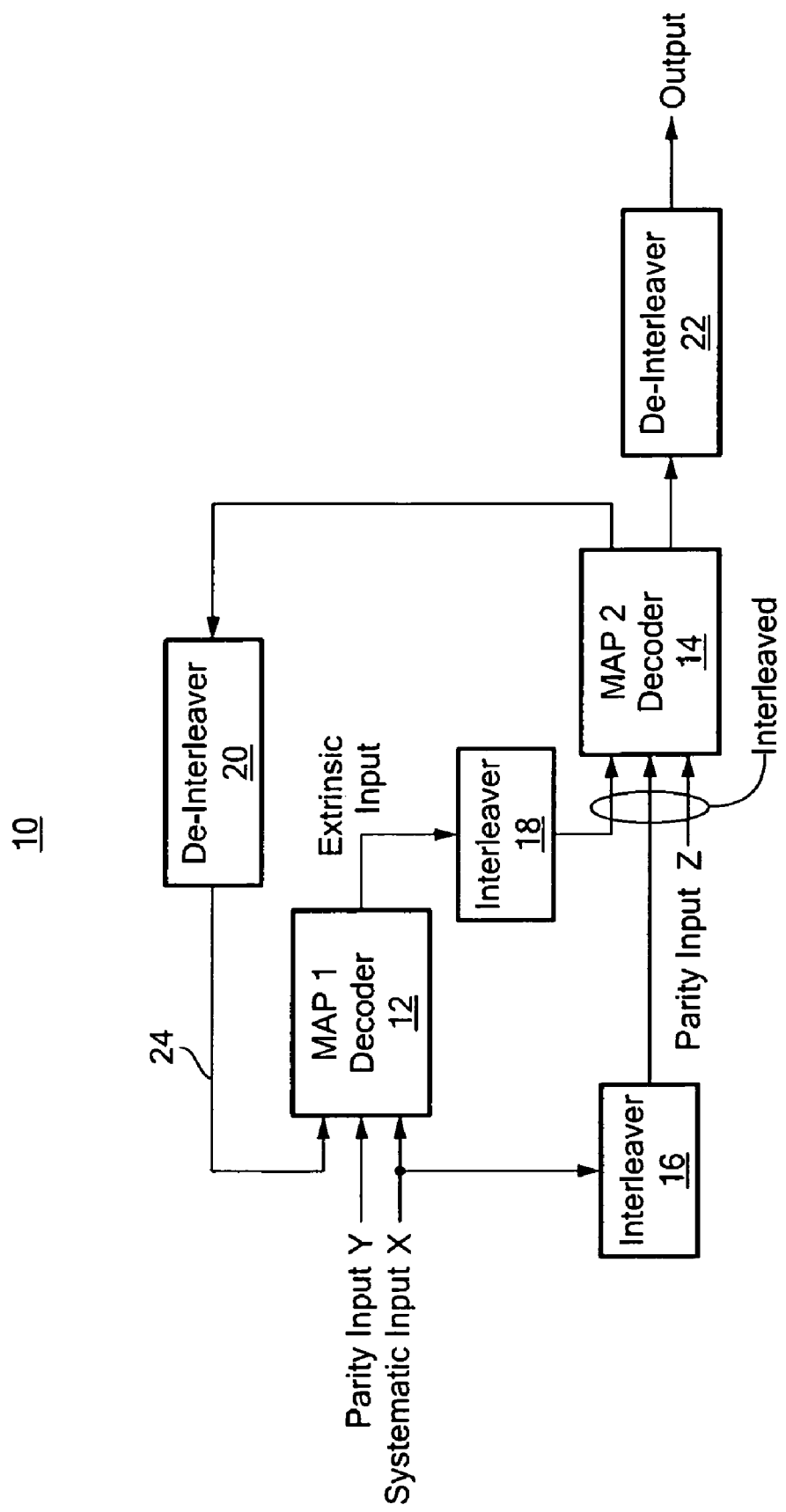
FIG. 1 is a schematic block diagram of a prior art turbo decoder system.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a conventional turbo decoder 10 including first and second maximum a posteriori (MAP) decoders 12 and 14 interleavers 16, 18 and de-interleavers 20, 22. In operation first MAP decoder 12 receives at its input systematic input X, a parity input Y and the feedback de-interleaved input on line 24 from the second decoder 14. First MAP decoder 12 provides from these inputs extrinsic information output to interleaver 18. The output of interleaver 18 is delivered to second MAP decoder 14 along with the interleaved systematic input X and a second interleaved parity input Z. Second MAP decoder 14 produces extrinsic information output which it delivers to the interleaver 20 where it is resubmitted to first MAP decoder 12 and a second loop is begun. These iterative loops may be 4, 6, 8, 16 in number or more depending upon the signal to noise ratio (SNR), the required Bit Error Rate (BER) and other factors. When the desired number of iterations has been accomplished the output is delivered through de-interleaver 22.

For a more detailed understanding of the operation of interleavers and decoders in a turbo decoder device the reader is referred to the references cited in the background of invention all of which are herein incorporated in their entirety by this reference.

Figure 2:
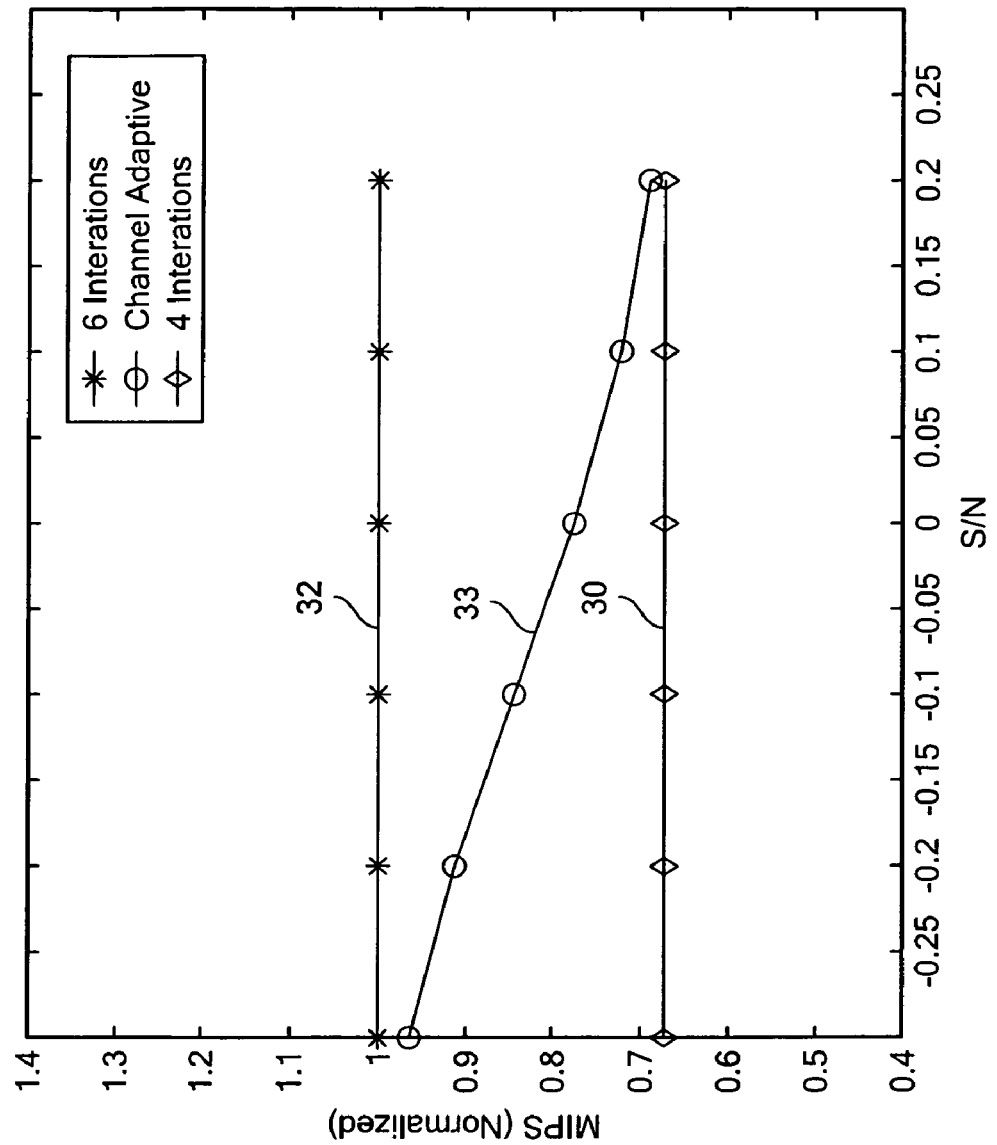
FIG. 2 is an illustration of variation in computing power required as a function of Signal to Noise Ratio (SNR).

Turbo decoders as noted previously have excellent performance and closely approach the Shannon limit, however, the price for this is high computing power or complexity. This is shown in FIG. 2, for example: if the MIPS are normalized to six iteration 32 turbo decoding, shown as 100%, then a four iteration 30, will use a constant 68% of the normalized MIPS (Million Instruction Per Second) regardless of the Signal to Noise Ratio (SNR) that may improve. Compare this to the performance of the channel adaptive iterative turbo decoder of the invention indicated at 33.

Figure 3:
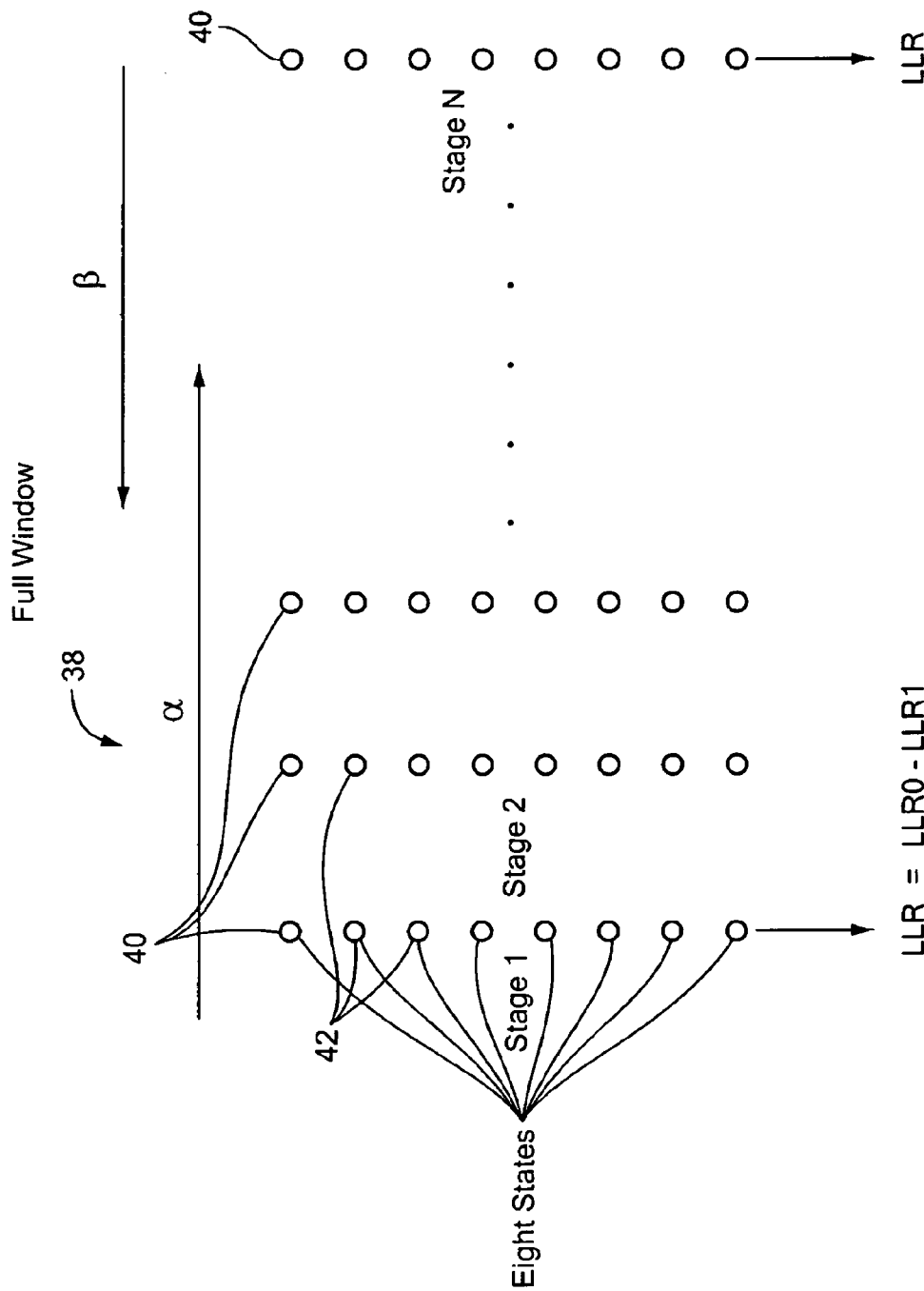
FIG. 3 is a simplified schematic view of a window of eight state stages of forward α and reverse β recursive path metric values.

The MAP decoders and interleavers must process a full window of data 38 of FIG. 3, which may include from forty up to 5,114 stages (as defined in 3GPP specification) 40 as depicted at stage 1 to stage N in FIG. 3. There each stage includes eight states reflecting, for example, that the turbo encoder, not shown, is using a generating polynomial of the third degree ($g_0(D)=1+D^2+D^3$ and $g_1(D)=1+D+D^3$) so eight states are represented. The forward recursive path state metric, α, and the reverse recursive path state metric, β, are represented at each state in each stage 42. After calculating these a MAP decoder then calculates the log likelihood ratio (LLR) for zero (0) and one (1) and does a logarithmic subtraction to obtain the LLR ratio which is then used to generate the extrinsic information. It is this term that is used to determine whether a particular bit is a one or a zero. For example, an output of 127 may mean certainly a one, of 100 may mean very likely a one, of zero may mean it could either be zero or a one, of −100 could mean very likely a zero and of −127 could be certainly a zero. These divisions are arbitrary and provided as an example only.

Figure 4:
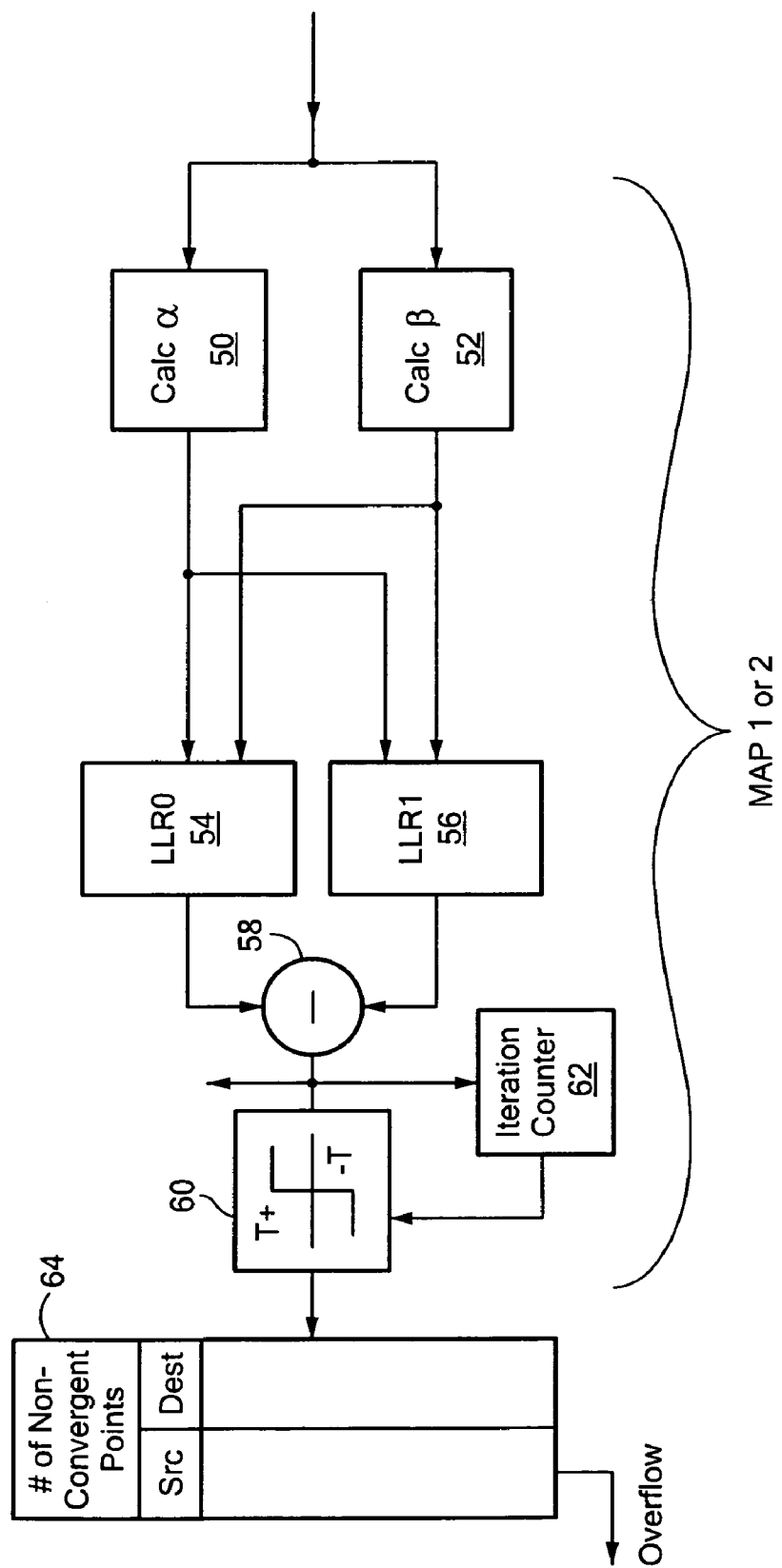
FIG. 4 is a schematic diagram of a MAP decoder with modifications according to this invention to achieve a "fast mode" operation.

In accordance with this invention, FIG. 4, each MAP includes a logic block for calculating, α, 50 and one for calculating, β, 52 as well as a logic block 54 for determining the log likelihood ratio for 0, LLR0, 54 and the log likelihood ratio for 1, LLR1, 56. After they are subtracted to obtain the ratio LLR in subtractor 58 this invention envisions a detector 60 which responds to that output to determine whether each data point is convergent or non-convergent. An iteration counter 62 counts the number of iterations or loops performed by the turbo decoder and after a predetermined number that is channel (SNR) depended typically 1-4 iterations enables detector 60. Detector 60 may be implemented with a threshold device that simply looks at the LLR ratio and determines whether it is above a first threshold T+ in which case it is a 1 or below a certain threshold −T in which case it is a 0. If its not, if it is between those two thresholds then it is stored in a table or a register file of the non-convergent points 64 and the number of non converged points is incremented by 1. Those thresholds T and −T could be for example [−128, +127] Detector 60 identifies the source from the previous interleaving and the destination in the next interleaving of each non-convergent point. Now, instead of all the 5,114 stages LLR0 and LLR1 from the full window of FIG. 3 being reprocessed each iteration there need be only processed the non-convergent points as identified in register file or storage 64. This modification could be made to either the first MAP decoder 12 or second MAP decoder 14 in, FIG. 1, to ensure that subsequent iterations process only the non-convergent points. Alternatively, the number of points contained in register file or storage 64, FIG. 4, could itself be used to trigger the processing of only non-convergent points. For example, if storage 64 were indeed a register file, such as an overflow register file, as long as the number of non-convergent points overflowed the register file the system would continue operating on the full complement of data points, but as soon as the overflow signal does not occur, meaning that the storage register file is just full or under full, the system can then switch to the so called fast mode where only the non-convergent LLR data points continue to be iteratively processed. The invention is preferably implemented in a microprocessor or digital signal processor or similar device.

Figure 5:
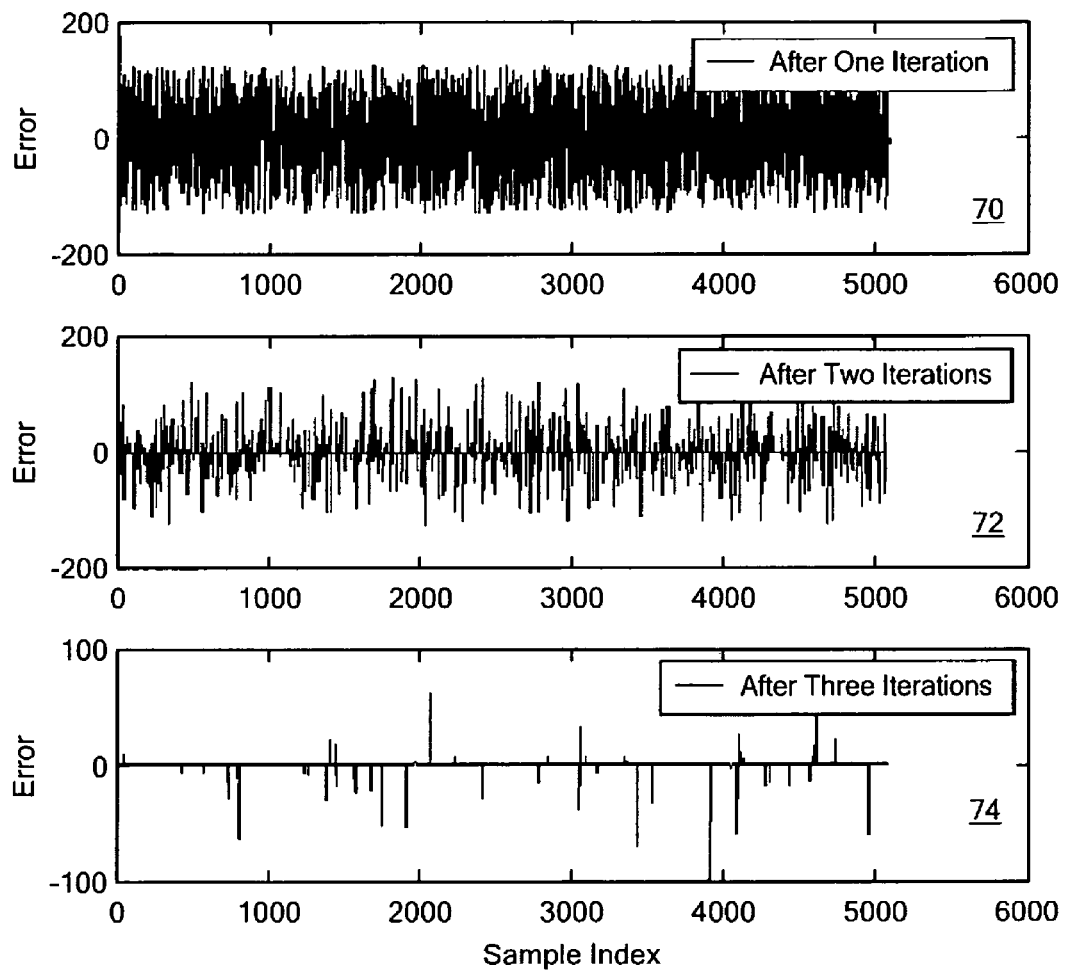
FIG. 5 illustrates the reduction in number of non-convergent points with each iteration.

Another aspect of this invention comes from the recognition that after each iteration the number of non-convergent points is reduced so that after a certain number of iterations the non-convergent points are few and from the further realization that an accurate convergence can be achieved with far fewer than the full window of decision bits. For example, FIG. 5, after one iteration 70, the number of non-convergent points is so great that they are virtually indistinguishable. After two iterations 72 they begin to appear more discrete, after three, 74, they show individuality.

Figure 6:
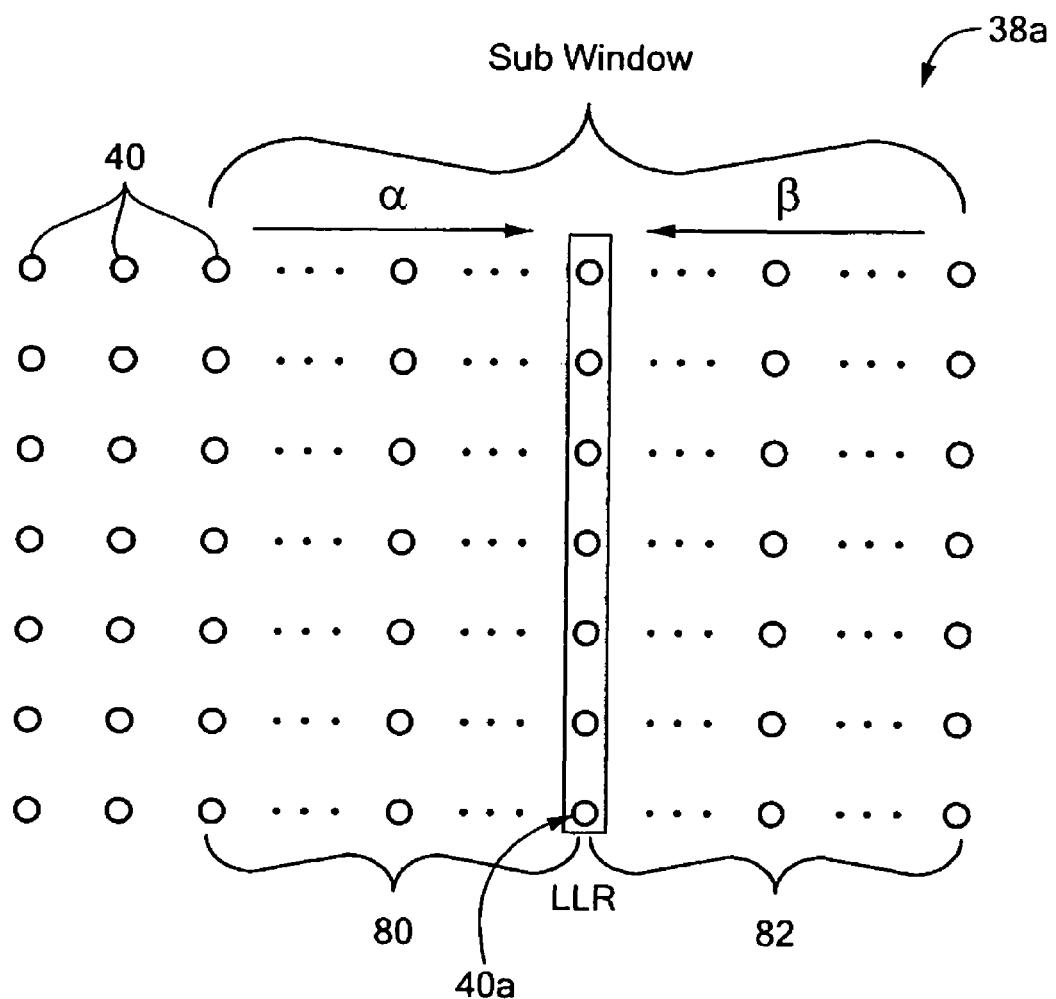
FIG. 6 is a simplified schematic view of a sub- or small window which can be used in a "super fast mode" when the number of non-convergent points has been reduced.
Figure 7:
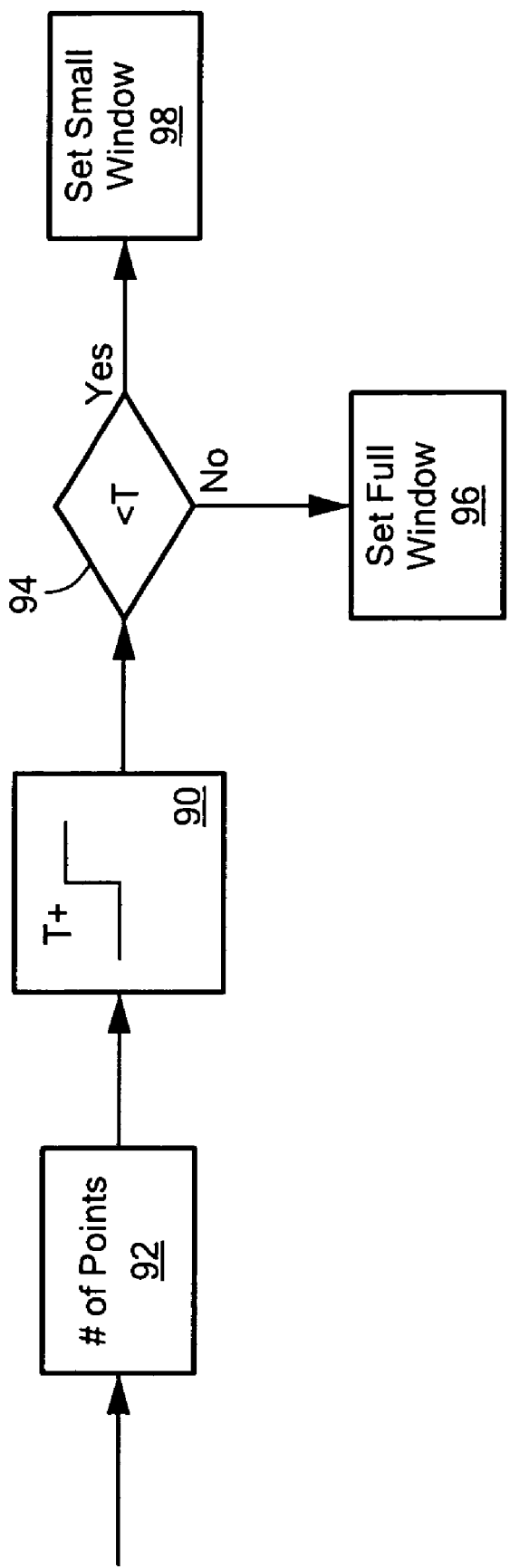
FIG. 7 is a schematic block diagram shows an implementation for triggering the "super fast mode"
Figure 8:
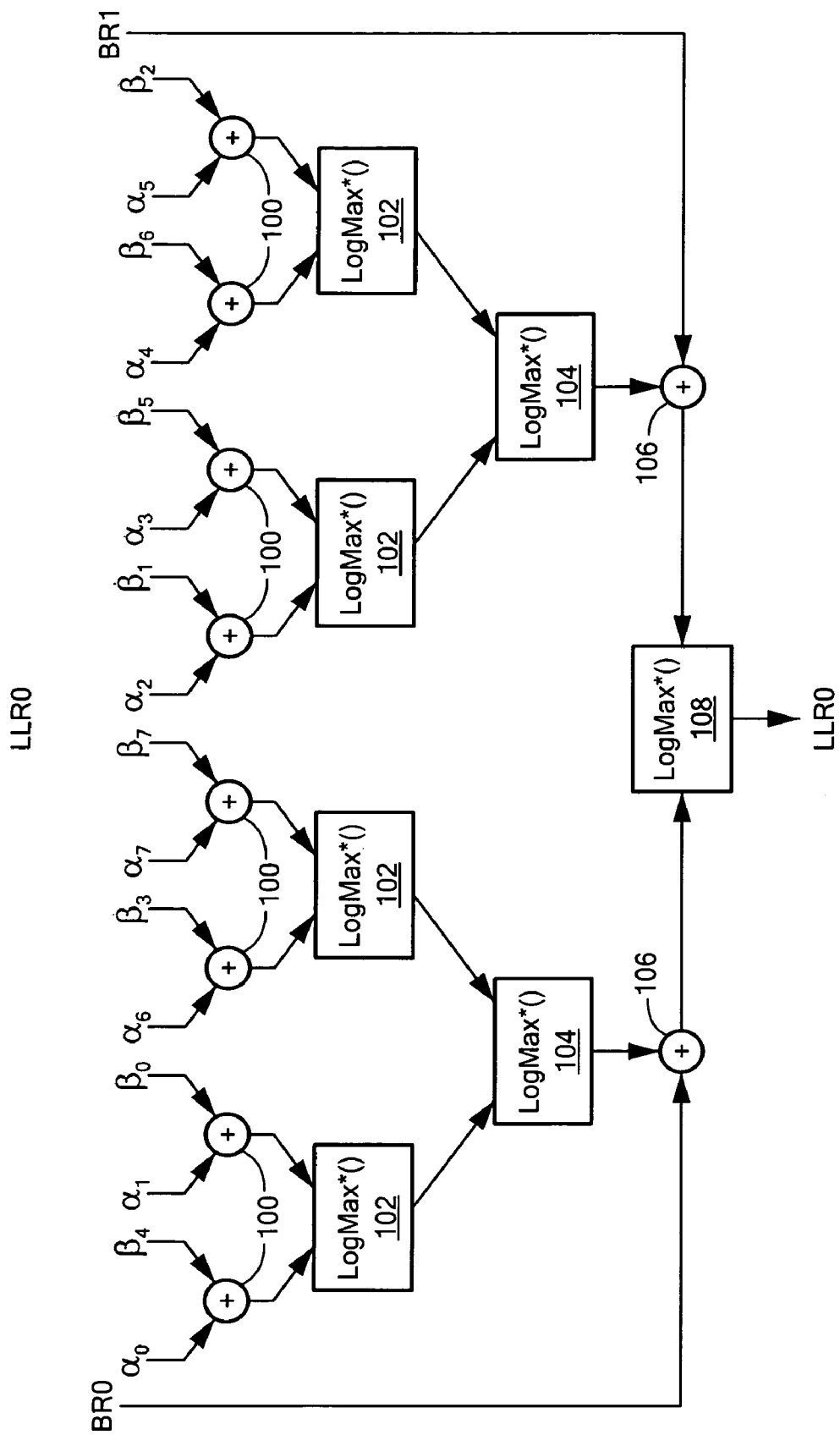
FIGS. 8 and 9 are simplified schematic diagrams of log likelihood ratio (LLR) circuits for calculating the likelihood for "0" and "1", respectively.
Figure 9:
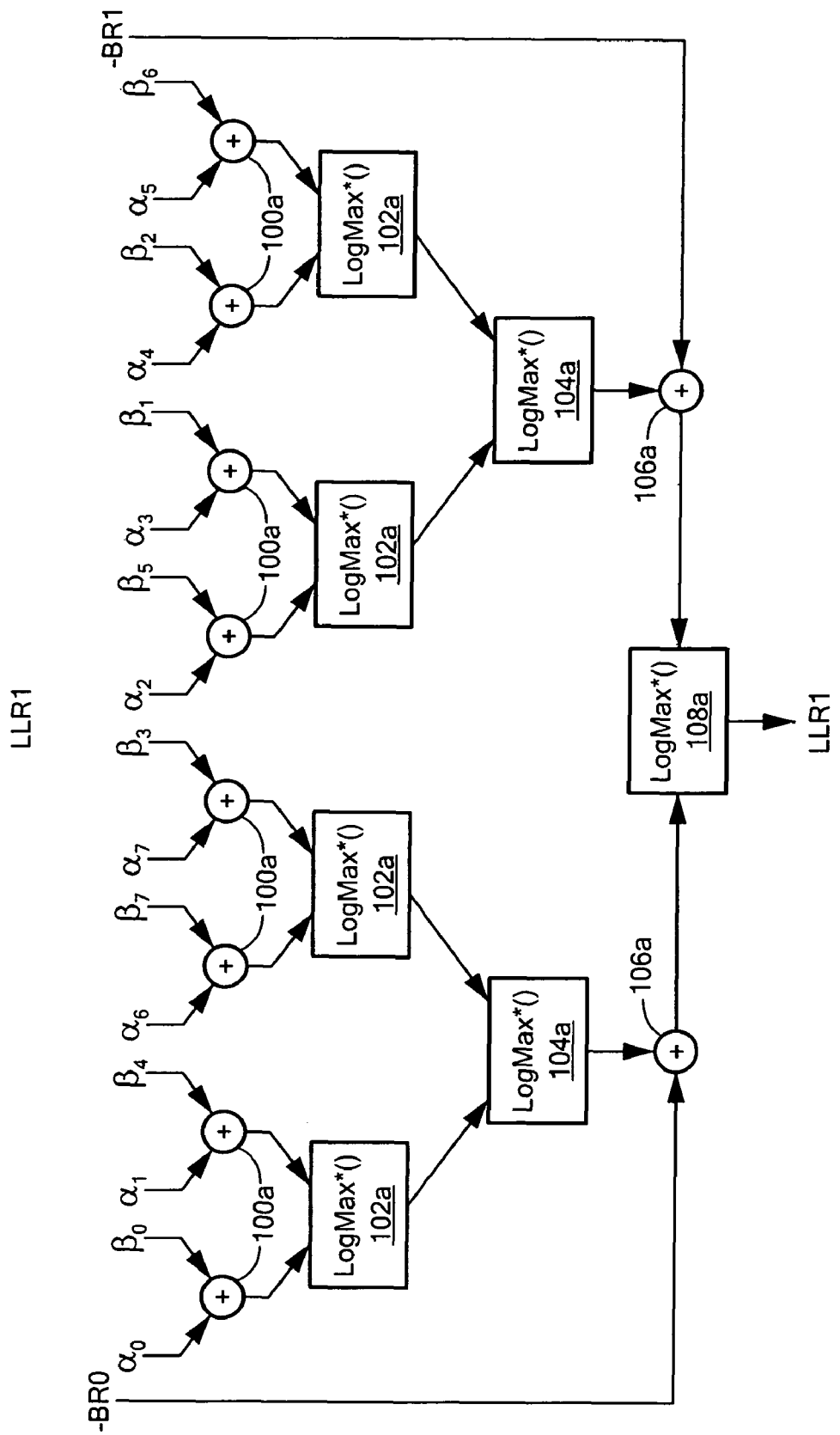

Thus this invention contemplates a super fast mode using a sub-window or small window 38a, FIG. 6. A small window can be used which uses the smaller number of stages just around the particular non-convergent point. For example, small window 38a instead of employing the full 5114 stages of the full window 38, may use just a few stages, for example, 40 stages 80, 82 on either side of the subject stage 40a. In this way the complexity of the computation is dramatically reduced in the super fast mode. This can be accomplished in one embodiment as shown in FIG. 7 by using a monitor 90 to identify the number of points that are non-convergent. When they fall below a particular threshold, for example, less then 200 points (if monitoring device 90 were a threshold circuit) the system decides 94 to no longer calculate the forward recursive path metric $\alpha$, the reverse recursive path metric $\beta$, LLR0 and LLR1 for the full window 96 but to instead calculate $\alpha$'s and $\beta$'s initialized with equal probabilities in a small window 98 around the particular non-convergent point, thereby dramatically reducing the number of computations required. The log likelihood ratio (LLR) circuit 54 for zero 0 is shown in greater detail in FIG. 8 where each of the eight forward states $\alpha_0$-$\alpha_7$ and reverse states $\beta_0$-$\beta_7$ are combined in pairs by summers 100 and then submitted to first Log Max*( ) logic 102 whose outputs are fed to a second Log Max*( ) logic 104 and then to summers 106 which combines those outputs with the branch metrics inputs BR0 and BR1 and provides their respective output to the final logic block, Log Max*( ) 108. While in this embodiment the logic blocks are shown as Log Max*(a,b)=Max(a,b)+ln(1+e$^{-|a-b|}$) they may as well be Max Log Max (a,b)=Max(a,b) circuits. The log likelihood ratio circuit for determining the one (1) convergence is shown in FIG. 9, where the same architecture is applied to states $\alpha_0$-$\alpha_7$ and $\beta_0$-$\beta_7$. Again although the logic blocks are shown as Log Max*( ) they may as well be Max Log Max ( ). When transmitting a full window the start and end states are known for calculating $\alpha$ and $\beta$. But with the small window that is not known so there is an initialization with equal probabilities. While this description uses a binary turbo decoding as an example: this is not a limitation. It may as well be effected with to a duo binary approach.

Figure 10:
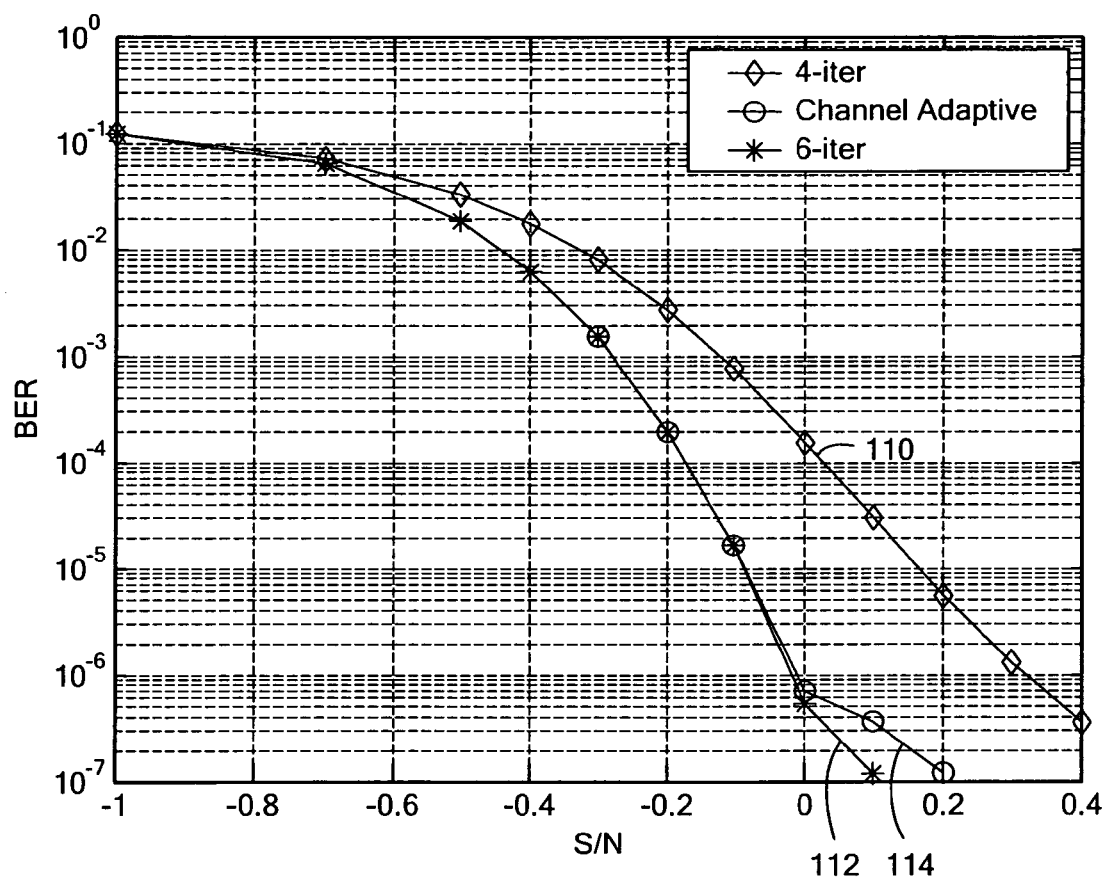
FIG. 10 illustrates that this invention's approach provides as good a Bit Error Rate (BER) as conventional turbo decoding even with a much improved reduction in MIPS.

While the invention in both the fast and super fast modes reduces the number of computations and computing power required as graphically depicted in FIG. 2 it provides as good a bit error rate as the standard conventional turbo decoder as shown in FIG. 10 where there is plotted a four iteration, a six iteration, characteristics for a turbo decoder and a channel adaptive decoder according to this invention. The four iteration 110 and the six iteration 112 have very good bit error rates which fall off gradually with signal to noise ratio. The channel adaptive plot 114, FIG. 10, lies essentially right on top of the six iteration characteristic evidencing that its bit error rate is every bit as good as that of a six iteration standard turbo decoder.

Figure 11:
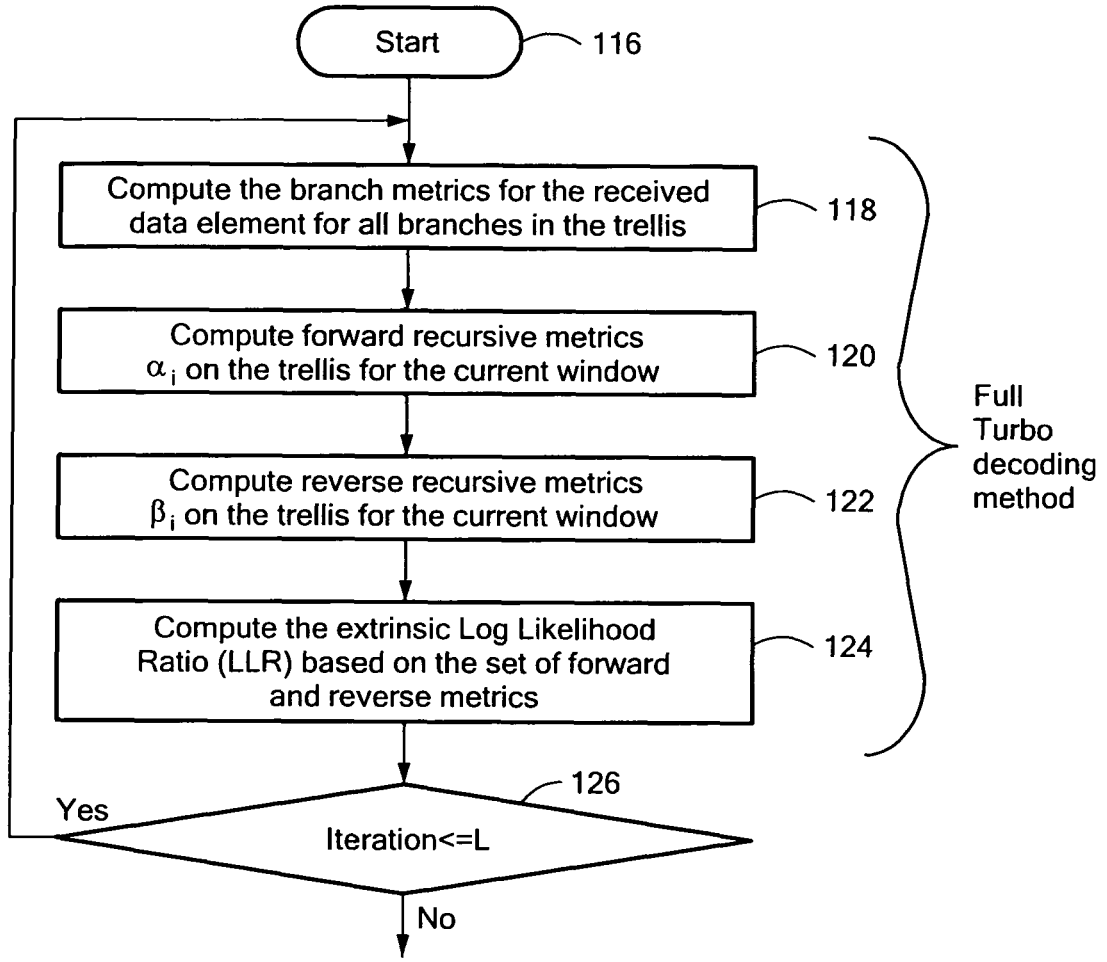
FIG. 11 illustrates the method of full decoding.

The full turbo decoding method is shown beginning in FIG. 11 with start block 116. The branch metrics for the received data elements for all branches in the trellis are computed 118, then the forward recursive metrics $\alpha_i$ are computed on the trellis for the current window 120, after which the backward recursive metrics $\beta_i$ are computed on the trellis for the current window 122. The extrinsic logic likelihood ratio (LLR) is computed based on the set of forward and backward metrics 124. Inquiry is then made 126 as to whether the iteration is less than L, if it is the system returns to step 118, if not the loop is completed.

Figure 12:
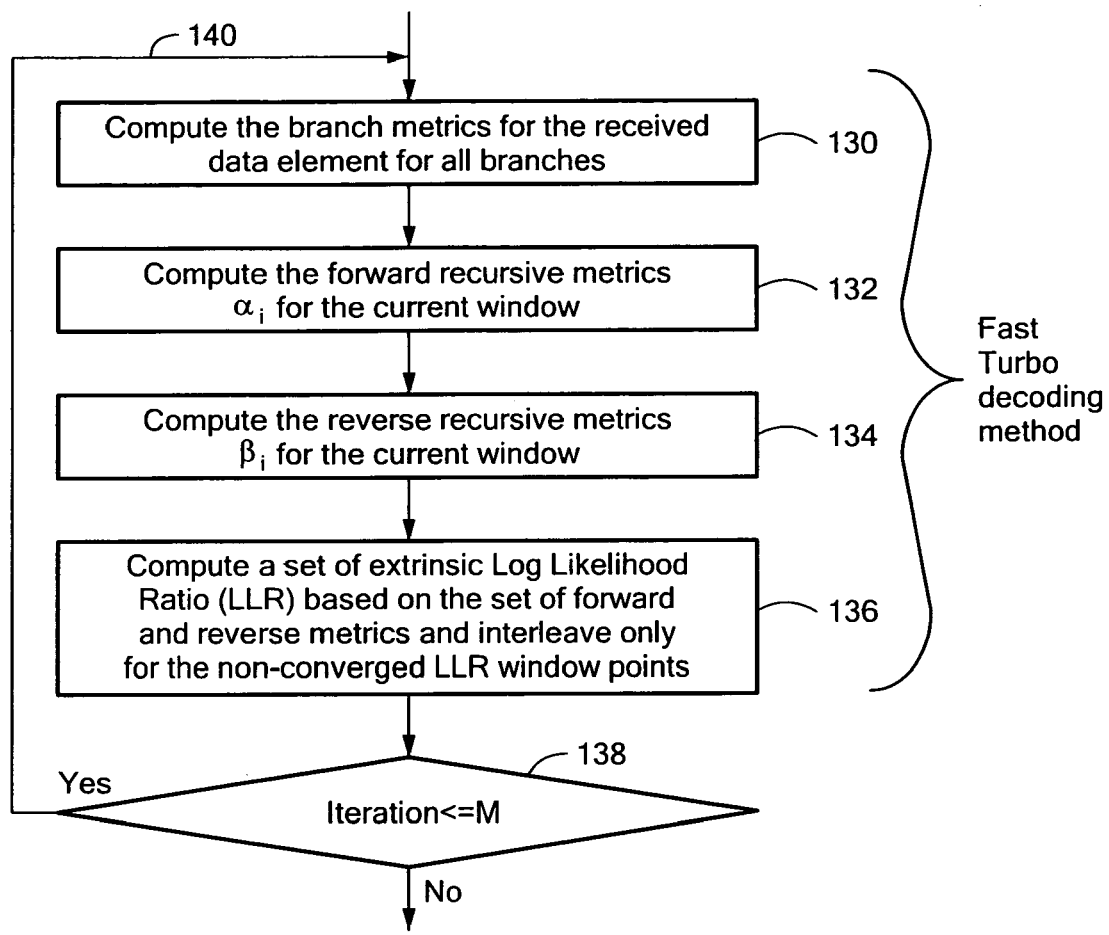
FIG. 12 illustrates the method of this invention for accomplishing the fast mode.

The invention involves a method of fast turbo decoding which can be accomplished in a number of ways. One method is shown in FIG. 12 where it begins with computing the branch metrics for the received data element for all branches 130, then computing the forward recursive metrics $\alpha_i$ for the current window 132, followed in step 134 by computing the reverse recursive metrics $\beta i$ for the current window. A set of extrinsic logic likelihood ratio (LLR) factors are computed based on the set of forward and reverse metrics and are interleaved only for the non-converging LLR window points 136. If the decision is made that the number of iterations is still fewer than a predetermined number M 138 more then 200 points the system loops back 140 and performs the iteration again; if not it continues on. Before step 136 a decision can be made that a sufficient number of iterations have occurred for the system to begin dealing only with non-convergent points or as explained previously a storage device could be monitored to detect when the non-convergent points have been reduced to a certain predefined number and at that point the system switches to process only non-convergent points.

Figure 13:
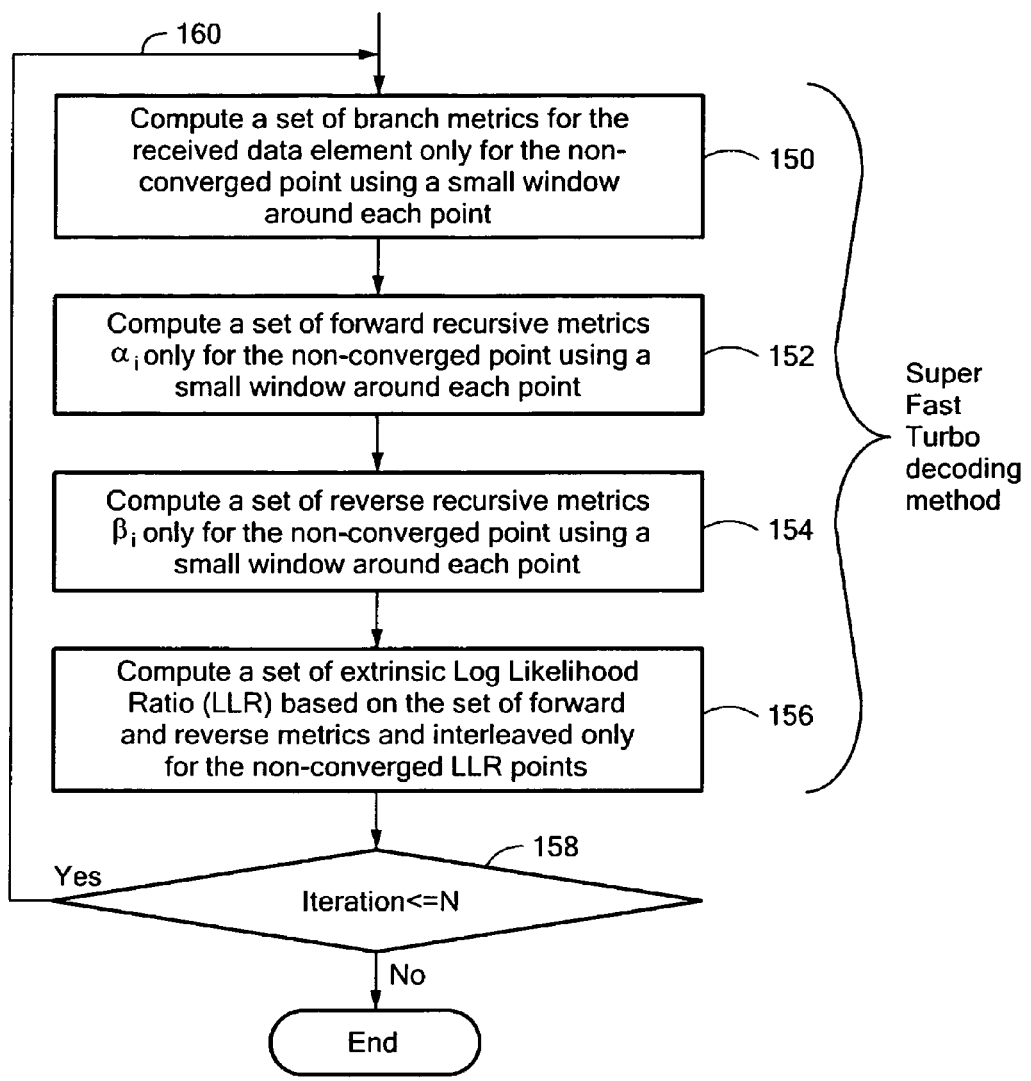
FIG. 13 illustrates the method of this invention for accomplishing the super fast mode.

The invention also contemplates a super fast mode, FIG. 13, in which a set of branch metrics for the receive data element is computed 150 only for the non-converged points using a small window around each point. Then a set of forward metrics 152 and a set of reverse recursive metrics are computed only for the non-converged points 154 using a small window around each point. Then a set of extrinsic logic likelihood ratios are computed 156 based on the set of forward and reverse metrics and interleaved only for the non-converged LLR points. If at this point the iterations have reached a predetermined number N 158 the iterations cease, otherwise they return 160 to begin the next iteration.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A channel adaptive iterative turbo decoder system comprising:
    first and second maximum a posteriori ("MAP") decoders for iteratively computing:
        (i) a set of branch metrics for a window of received data bits,
        (ii) forward recursive path state metrics for the window,
        (iii) reverse recursive path state metrics for the window, and
        (iv) from the forward and reverse recursive path state metrics, a log likelihood ratio ("LLR") for 1 and 0 for each data bit in the window;
    an iteration counter for counting a number of iterations performed by at least one of the MAP decoders; and
    a non-convergence detector for, only after a predetermined channel-dependent number of iterations, identifying those data bits in the window of received data which are non-convergent to 0 or 1 and enabling at least one of the first and second MAP decoders to compute:
        (i) a set of branch metrics for the received data,
        (ii) forward recursive path state metrics for the window,
        (iii) reverse recursive path state metrics for the window, and
        (iv) from the forward and reverse recursive path state metrics, the LLR for 1 and 0 for only the non-convergent data bits.

2. The channel adaptive iterative turbo decoder system of claim 1 further including a monitor device responsive to the number of non-convergent data bits from at least one MAP decoder, and, when the number of non-convergent data bits falls below a threshold, for enabling the at least one MAP decoder to define a reduced small window of path state metrics around each non-convergent data bit and to compute from those path metrics the log likelihood ratio for 1 and 0 for each non-convergent data bit and interleaving the non-convergent bits.

3. The channel adaptive iterative turbo decoder system of claim 2 in which the reverse and forward recursive path state metrics are initialized with equal probabilities in each said small window around the non-converged data bits.

4. The channel adaptive iterative turbo decoder system of claim 2, wherein the reduced small window of path state metrics employs a number of stages less than a total number of states of a full data window.

5. The channel adaptive iterative turbo decoder system of claim 2, wherein the reduced small window of path state metrics employs 40 stages on either side of a subject stage.

6. The channel adaptive iterative turbo decoder system of claim 1 in which said reverse recursive path state metrics are initialized with equal probabilities.

7. The channel adaptive iterative turbo decoder system of claim 1 in which said forward and reverse recursive path state metrics and LLR are calculated using Log Max*( ).

8. The channel adaptive iterative turbo decoder system of claim 1 in which said forward and reverse recursive path state metrics and LLR are calculated using Max Log Max( ).

9. The channel adaptive iterative turbo decoder system of claim 1 in which said turbo decoder is a binary turbo decoder.

10. The channel adaptive iterative turbo decoder system of claim 1 in which said turbo decoder is a duo binary turbo decoder.

11. The channel adaptive iterative turbo decoder system of claim 1, wherein the predetermined channel-dependent number of iterations ranges from one to four iterations.

12. The channel adaptive iterative turbo decoder system of claim 1, wherein, after the predetermined channel-dependent number of iterations, the non-convergent bits are interleaved.

13. A channel adaptive iterative turbo decoder method comprising:
    iteratively computing with maximum a posteriori ("MAP") decoders a set of branch metrics for a window of received data, computing forward and reverse recursive path state metrics, and computing, from the forward and reverse recursive path state metrics, a log likelihood ratio ("LLR") for 1 and 0 for each data bit in the window;
    interleaving the data bits;
    counting a number of iterations performed by the first and second MAP decoders;
    only after a predetermined channel-dependent number of iterations, identifying MAP decoder data bits which are non-convergent, and, thereafter, computing a set of branch metrics for the received data, computing forward and reverse recursive path state metrics for the window, and computing from the forward and reverse recursive path state metrics, the log likelihood ratio (LLR) for 1 and 0 for only the non-converged data bits; and
    interleaving the non-convergent data bits.

14. The channel adaptive iterative turbo decoder method of claim 13 further including defining, responsive to the number of MAP decoder non-convergent data bits and when the number of MAP decoder non-convergent data bits falls below a threshold, a reduced small window of path state metrics around each non-convergent data bit;
    computing from those path metrics the log likelihood ratio for 1 and 0 for each non-convergent data bit; and
    interleaving the non-convergent bits.

15. The channel adaptive iterative turbo decoder method of claim 14 in which the reverse and forward recursive path state metrics in each said small window around the non-converged data bits are initialized with equal probability.

16. The channel adaptive iterative turbo decoder method of claim 14, wherein the reduced small window of path state metrics employs a number of stages less than a total number of states of a full data window.

17. The channel adaptive iterative turbo decoder method of claim 14, wherein the reduced small window of path state metrics employs 40 stages on either side of a subject stage.

18. The channel adaptive iterative turbo decoder method of claim 13 in which the reverse recursive path state metrics are initialized with equal probabilities.

19. The channel adaptive iterative turbo decoder method of claim 13 in which said forward and reverse recursive path state metrics and LLR are calculated using Log Max*( ).

20. The channel adaptive iterative turbo decoder method of claim 13 in which said forward and reverse recursive path state metrics and LLR are calculated using Max Log Max( ).

21. The channel adaptive iterative turbo decoder method of claim 13 in which the turbo decoder method is a binary turbo decoder method.

22. The channel adaptive iterative turbo decoder method of claim 13 in which the turbo decoder method is a duo binary turbo decoder method.

23. The channel adaptive iterative turbo decoder method of claim 13, wherein the predetermined channel-dependent number of iterations ranges from one to four iterations.

24. The channel adaptive iterative turbo decoder method of claim 13, wherein, interleaving the non-convergent data bits comprises interleaving only the non-convergent bits.

* * * * *

UNITED STATES PATENT AND TRADEMARK OFFICE
CERTIFICATE OF CORRECTION

PATENT NO.        : 8,321,744 B2
APPLICATION NO.   : 12/283863
DATED             : November 27, 2012
INVENTOR(S)       : Yosef Stein et al.

It is certified that error appears in the above-identified patent and that said Letters Patent is hereby corrected as shown below:

In the claims, columns 7-10, cancel the text under "What is claimed is:" and insert the following:

-- 1. A channel adaptive iterative turbo decoder system comprising:
   first and second maximum a posteriori ("MAP") decoders for iteratively computing:
      (i) a set of branch metrics for a window of received data bits,
      (ii) forward recursive path state metrics for the window,
      (iii) reverse recursive path state metrics for the window, and
      (iv) from the forward and reverse recursive path state metrics, a log likelihood ratio ("LLR") for 1 and 0 for each data bit in the window;
   an iteration counter for counting a number of iterations performed by at least one of the MAP decoders; and
   a non-convergence detector for, only after a predetermined channel-dependent number of iterations, identifying those data bits in the window of received data which are non-convergent to 0 or 1 and enabling at least one of the first and second MAP decoders to compute:
      (i) a set of branch metrics for the received data,
      (ii) forward recursive path state metrics for the window,
      (iii) reverse recursive path state metrics for the window, and
      (iv) from the forward and reverse recursive path state metrics, the LLR for 1 and 0 for only the non-convergent data bits.

Signed and Sealed this
Twenty-third Day of April, 2013

Teresa Stanek Rea
*Acting Director of the United States Patent and Trademark Office*

2. The channel adaptive iterative turbo decoder system of claim 1 further including a monitor device responsive to the number of non-convergent data bits from at least one MAP decoder, and, when the number of non-convergent data bits falls below a threshold, for enabling the at least one MAP decoder to define a reduced small window of path state metrics around each non-convergent data bit and to compute from those path metrics the log likelihood ratio for 1 and 0 for each non-convergent data bit and interleaving the non-convergent bits.

3. The channel adaptive iterative turbo decoder system of claim 1 in which said reverse recursive path state metrics are initialized with equal probabilities.

4. The channel adaptive iterative turbo decoder system of claim 2 in which the reverse and forward recursive path state metrics are initialized with equal probabilities in each said small window around the non-converged data bits.

5. The channel adaptive iterative turbo decoder system of claim 1 in which said forward and reverse recursive path state metrics and LLR are calculated using LogMax*( ).

6. The channel adaptive iterative turbo decoder system of claim 1 in which said forward and reverse recursive path state metrics and LLR are calculated using MaxLogMax( ).

7. The channel adaptive iterative turbo decoder system of claim 1 in which said turbo decoder is a binary turbo decoder.

8. The channel adaptive iterative turbo decoder system of claim 1 in which said turbo decoder is a duo binary turbo decoder.

9. A channel adaptive iterative turbo decoder method comprising:
    iteratively computing with maximum a posteriori ("MAP") decoders a set of branch metrics for a window of received data, computing forward and reverse recursive path state metrics, and computing, from the forward and reverse recursive path state metrics, a log likelihood ratio ("LLR") for 1 and 0 for each data bit in the window;
        interleaving the data bits;
        counting a number of iterations performed by the first and second MAP decoders;

only after a predetermined channel-dependent number of iterations, identifying MAP decoder data bits which are non-convergent, and, thereafter, computing a set of branch metrics for the received data, computing forward and reverse recursive path state metrics for the window, and computing from the forward and reverse recursive path state metrics, the log likelihood ratio (LLR) for 1 and 0 for only the non-converged data bits; and interleaving the non-convergent data bits.

10. The channel adaptive iterative turbo decoder method of claim 9 further including defining, responsive to the number of MAP decoder non-convergent data bits and when the number of MAP decoder non-convergent data bits falls below a threshold, a reduced small window of path state metrics around each non-convergent data bit;

computing from those path metrics the log likelihood ratio for 1 and 0 for each non-convergent data bit; and interleaving the non-convergent bits.

11. The channel adaptive iterative turbo decoder method of claim 9 in which the reverse recursive path state metrics are initialized with equal probabilities.

12. The channel adaptive iterative turbo decoder method of claim 10 in which the reverse and forward recursive path state metrics in each said small window around the non-converged data bits are initialized with equal probability.

13. The channel adaptive iterative turbo decoder method of claim 9 in which said forward and reverse recursive path state metrics and LLR are calculated using Log Max* ( ).

14. The channel adaptive iterative turbo decoder method of claim 9 in which said forward and reverse recursive path state metrics and LLR are calculated using MaxLog Max ( ).

15. The channel adaptive iterative turbo decoder method of claim 9 in which the turbo decoder method is a binary turbo decoder method.

16. The channel adaptive iterative turbo decoder method of claim 9 in which the turbo decoder method is a duo binary turbo decoder method.

17. The channel adaptive iterative turbo decoder system of claim 1, wherein the predetermined channel-dependent number of iterations ranges from one to four iterations.

18. The channel adaptive iterative turbo decoder system of claim 1, wherein, after the predetermined channel-dependent number of iterations, the non-convergent bits are interleaved.

19. The channel adaptive iterative turbo decoder system of claim 2, wherein the reduced small window of path state metrics employs a number of stages less than a total number of states of a full data window.

20. The channel adaptive iterative turbo decoder system of claim 2, wherein the reduced small window of path state metrics employs 40 stages on either side of a subject stage.

21. The channel adaptive iterative turbo decoder method of claim 9, wherein the predetermined channel-dependent number of iterations ranges from one to four iterations.

22. The channel adaptive iterative turbo decoder method of claim 9, wherein, interleaving the non-convergent data bits comprises interleaving only the non-convergent bits.

23. The channel adaptive iterative turbo decoder method of claim 10, wherein the reduced small window of path state metrics employs a number of stages less than a total number of states of a full data window.

24. The channel adaptive iterative turbo decoder method of claim 10, wherein the reduced small window of path state metrics employs 40 stages on either side of a subject stage. --